United States Patent
Hsien

(10) Patent No.: US 6,265,255 B1
(45) Date of Patent: Jul. 24, 2001

(54) ULTRA-SHALLOW JUNCTION FORMATION FOR DEEP SUB-MICRON COMPLEMENTARY METAL-OXIDE-SEMICONDUCTOR

(75) Inventor: Li-Jen Hsien, Taichung (TW)

(73) Assignee: United Microelectronics Corp., Hsin-Chu (TW)

( * ) Notice: Subject to any disclaimer, the term of this patent is extended or adjusted under 35 U.S.C. 154(b) by 0 days.

(21) Appl. No.: 09/531,095

(22) Filed: Mar. 17, 2000

(51) Int. Cl.⁷ .................................... H01L 21/8238
(52) U.S. Cl. .................... 438/199; 438/223; 438/229; 438/230
(58) Field of Search .......................... 438/199, 213, 438/223, 224, 227, 228, 229, 230, 231, 232, 558, 559, 563

(56) References Cited

U.S. PATENT DOCUMENTS 5,759,885 * 6/1998 Son ........................................ 438/230
5,981,321 * 11/1999 Chao .................................... 438/199
5,985,768 * 11/1999 Speranza et al. .................... 438/783
6,136,636 * 6/1998 Wu ....................................... 438/231

* cited by examiner

Primary Examiner—Charles Bowers
Assistant Examiner—Jack Chen

(57) ABSTRACT

A semiconductor substrate having an n-well region, a p-well region and shallow trench isolation (STI) regions is provided. Poly-gates are formed over the n-well region and p-well region respectively. First, nitrogen oxide (such as NO, $N_2O$) layer are formed on surface of the aforesaid structure by furnace or rapid thermal oxidation (RTO). A photoresist layer is formed over the p-well region, and then $BF_2$ or boron ion implantation is carried out to form a nitrogen oxide (such as NO, $N_2O$) layer having boron ion in the n-well region. Another photoresist layer is formed over the n-well region after removing the photoresist layer. Arsenic ion implantation is then carried out to form a nitrogen oxide (such as NO, $N_2O$) layer having arsenic ion in the p-well region. Next, spacer is formed on the sidewall of gates after removing the photoresist layer. Finally, deep source/drain implantation are carried out once again. And then, ultra-shallow junctions are formed in the source/drain regions of Complementary Metal-Oxide-Semiconductor devices by performing one step rapid thermal process.

11 Claims, 6 Drawing Sheets

ULTRA-SHALLOW JUNCTION FORMATION FOR DEEP SUB-MICRON COMPLEMENTARY METAL-OXIDE-SEMICONDUCTOR

BACKGROUND OF THE INVENTION

1. Field of the Invention

The present invention relates generally to a method of manufacturing semiconductor devices, and more particularly, to a method for forming Complementary Metal-Oxide-Semiconductor (CMOS) devices having ultra-shallow junctions.

2. Description of the Prior Art

As semiconductor devices, such as Complementary Metal-Oxide-Semiconductor devices, become highly integrated, the area occupied by the devices shrinks, as well as the design rule. With advances in semiconductor technology, the dimensions of the integrated circuit (IC) devices have shrunk to the deep sub-micron range. As the semiconductor device continuously shrinks to deep sub-micron region, some problems are incurred due to the process of scaling down.

A cross-sectional view of a fabricating shallow junctions process in Complementary Metal-Oxide-Semiconductor device of the prior art is illustrated in FIG. 1A to FIG. 1E. A semiconductor substrate 2 having an n-well region 4, a p-well region 6, and a shallow trench isolation (STI) 8 region is provided. Poly-gates 10 are also formed over the n-well region 4 and the p-well region 6 respectively, as shown in FIG. 1A. First, amorphous regions 12 and 13 are formed on the n-well region 4 and the p-well region 6 of the foresaid structure using the Ge Pre-amorphization method 9 with energy of between 2 keV and 5 keV. A photoresist layer 14 is formed over the p-well region 6, and then the p-type ion implantation 16 is carried out to dope a part of the diffusion source layer forming p-type shallow junctions 18 over the n-well region 4, by using boron ions with energy less then 1 keV, as shown in FIG. 1B. Therefore, the diffusion layer formed over the n-well region 4 contains p-type ions. After removing the photoresist layer 14, another photoresist layer 20 is formed over the n-well region 4 serving as an ion implantation mask, and then n-type ion implantation 22 is carried out to dope a part of the diffusion source layer formed n-type shallow junctions 24 over the p-well region 6, by using arsenic ions with energy less then 2 keV, as shown in FIG. 1C. Therefore, the diffusion layer formed over the p-well region 6 contains n-type ions. Next, the spacers 26 are formed on the sidewall of poly-gate by depositing and etching back after removing the photoresist layer 20, and the result is depicted in FIG. 1D. Then, the p-type ion implantation 16 and the n-type ion implantation 22 are carried out to the n-well region 4 and the p-well region 6 respectively again. Finally, one step rapid thermal process (RTP) at about 1000° C. for about 15 seconds is carried out to form the source/drain regions 28 and 30 in the Complementary Metal-Oxide-Semiconductor devices, as shown in FIG. 1E.

The evolution of integrated circuits has involved scaling down the device geometries. In deep sub-micron Complementary Metal-Oxide-Semiconductor technology, shallow junctions are required to alleviate or avoid the influences of the short channel effect. As the channel length of the Complementary Metal-Oxide-Semiconductor is scaled, it has become necessary to reduce the source/drain(S/D) junctions depths (in the drain extension regions near the channel) to prevent short channel effects. And yet, the conventional shallow junctions process is very difficult to perform below 0.18 micrometer. However, the formation of p+/n source/drain shallow junctions using boron ions implants and n+/p source/drain shallow junctions using arsenic ions or phosphorous ions implants face severe physical limitations. The influence of ion channel effect on boron ions is greater than that of arsenic, because the diffusion coefficient of boron ions is greater than that of arsenic ions or phosphorous ions. Therefore, forming the ultra-shallow junction p+/n source/drain and n+/p source/drain simultaneously are very difficult.

According to the channel effect of ion implantation, this will lead to difficulty with junction depth control after ions implant in the semiconductor device. Hence, in the conventional process, the Pre-amorphization by a germanium (Ge) implant prior to the dopant implant eliminates ion-channeling completely. The Ge Pre-amorphization implantation creates an amorphous layer in the crystalline substrate. However, it also creates defects (interstitials) beyond the amorphous layer/crystalline substrate interface. Moreover, the Ge Pre-amorphization implantation will cause damage on the silicon substrate surface.

Conventionally, the ion implant energy, which reduced the projected range of the dopants, has to be reduced to reduce the junctions depth. For low energy of the boron ions implants (less than 10keV), it is not possible to reduce the junctions depth eminently by reducing the energy of the ion implant. Transient enhance diffusion(TED)results from the boron dopant combining with interstitials in the silicon. The boron-interstitial combination diffuses much faster during the annealing period than the boron alone causing deeper junctions depths. Even though shallow junctions process is performed by boron ion implants energy below sub-keV (less than 1 keV), the TED and OED (Oxygen enhance diffusion) effects are still existing and throughput is very less too. Moreover, boron ion implants energy below sub-keV is not very practical using today's equipment, and the ion implanter apparatus not only must change the new one but also is not a suited one to mass production up to the present.

In accordance with the above description, a new and improved method for fabricating the Complementary Metal-Oxide-Semiconductor device is therefore necessary, so as to raise the yield and quality of the follow-up process.

SUMMARY OF THE INVENTION

In accordance with the present invention, a method is provided for fabricating the Complementary Metal-Oxide-Semiconductor devices having ultra-shallow junctions construction that substantially overcomes drawbacks of the above mentioned problems which arise from conventional methods.

Accordingly, it is an object of the present invention to provide a method for fabricating the Complementary Metal-Oxide-Semiconductor devices having the ultra-shallow junctions, so as to form the small size and high performance elements. The method is appropriate for deep sub-micron technology to provide the Complementary Metal-Oxide-Semiconductor devices with junctions of ultra-shallow depth and of low resistance.

Another object of the present invention is to provide a method of forming ultra-shallow junctions that is compatible with the conventional Complementary Metal-Oxide-Semiconductor process, and is simple enough to not require additional apparatus. Hence, the method of the present invention does not change the concerned apparatus to correspond to a desired economic effect.

Still another object of the present invention is to alleviate short channel effect by way of forming the ultra-shallow junctions. And yet, TED and OED can be reduced by this method. Moreover, the method of the present invention does not result as damage as the Ge Pre-amorphization does in silicon substrate.

A further object of the present invention is to form a nitrogen oxide (such as NO, $N_2O$) layer on the silicon substrate having poly-gates by means of the furnace or the rapid thermal oxidation (RTO). After the bond is broken between nitrogen and oxygen in the nitrogen oxide layer, the activity of nitrogen will become great for catching boron ions on the silicon substrate easily. Thus, good ultra-shallow junctions integrity can be formed on the silicon substrate due to nitrogen easily catching a boron ion.

In accordance with the present invention, a method for forming semiconductor devices is disclosed. In one embodiment of the present invention, a semiconductor substrate having an n-well region, a p-well region, and shallow trench isolation (STI) regions is provided. Poly-gates are formed over the n-well region and the p-well region respectively. First, nitrogen oxide (such as NO, $N_2O$) layers are formed on the surface of the aforesaid structure by the furnace or the rapid thermal oxidation (RTO). The thickness of the nitrogen oxide (such as NO, $N_2O$) layer is about between 20 nm and 30 nm, and nitrogen oxide (such as NO, $N_2O$) layer is used as diffusion source. A photoresist layer is formed over the p-well region serving as an ion implantation mask. The p-type ion implantation is then carried out to dope a part of the diffusion source layer formed on the p-type diffusion source layer over the n-well region by using the $BF_2$ or boron ions with energy of between 2 keV and 8 keV, the dosage being between about $10^{14}$ and $10^{15}$ herein. Therefore, the diffusion layer formed over the n-well region contains the p-type ions. After removing the photoresist layer from the p-well region, another photoresist layer is formed over the n-well region serving as an ion implantation mask. The n-type ion implantation is then carried out to dope the other part of the diffusion source layer formed the n-type diffusion source layer over the p-well region using arsenic ions or phosphorous ions with energy of between 2 KeV and 8 KeV, the dosage being between about $10^{14}$ and $10^{15}$ herein. Therefore, the diffusion layer formed over the p-well region contains n-type ions. Next, spacers are formed on the sidewall of the poly-gates by depositing and etching back after removing the photoresist layer over the n-well region. Then, the p-type deep source/drain implantation and the n-type deep source/drain implantation are carried out once again to the n-well region and the p-well region respectively. Finally, the boron ions and arsenic ions or phosphorous are out-diffused from nitrogen oxide (such as NO, $N_2O$) layer into silicon substrate by performing one step rapid thermal process (RTP) at about 950° C. and 1050° C. for between about 10 seconds and 20 seconds. Ultra-shallow junctions are formed in the source/drain regions of the Complementary Metal-Oxide-Semiconductor devices.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DESCRIPTION OF THE PREFERRED EMBODIMENT

Although specific embodiments have been illustrated and described, it will be obvious to those skilled in the art that various modifications may be made without departing from what is intended to be limited solely by the appended claims.

Figure 1A:
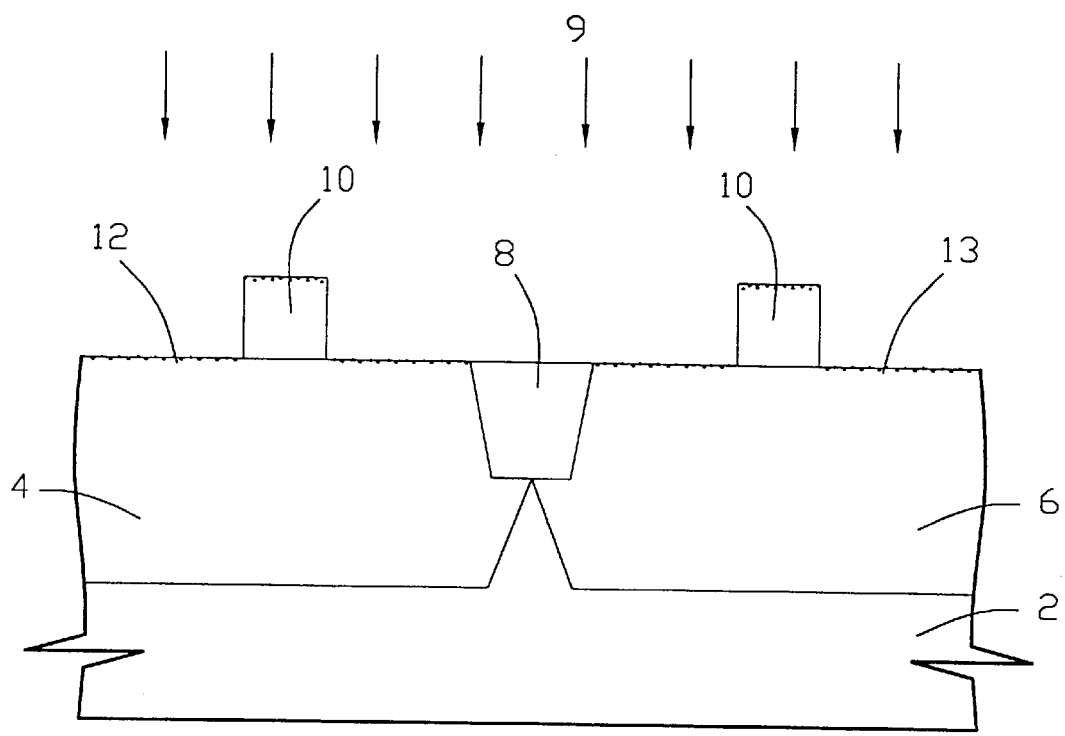
FIGS. 1A to 1E show cross-sectional views illustrative of various stages in the conventional shallow junctions process of Complementary Metal-Oxide-Semiconductor devices.
Figure 1B:
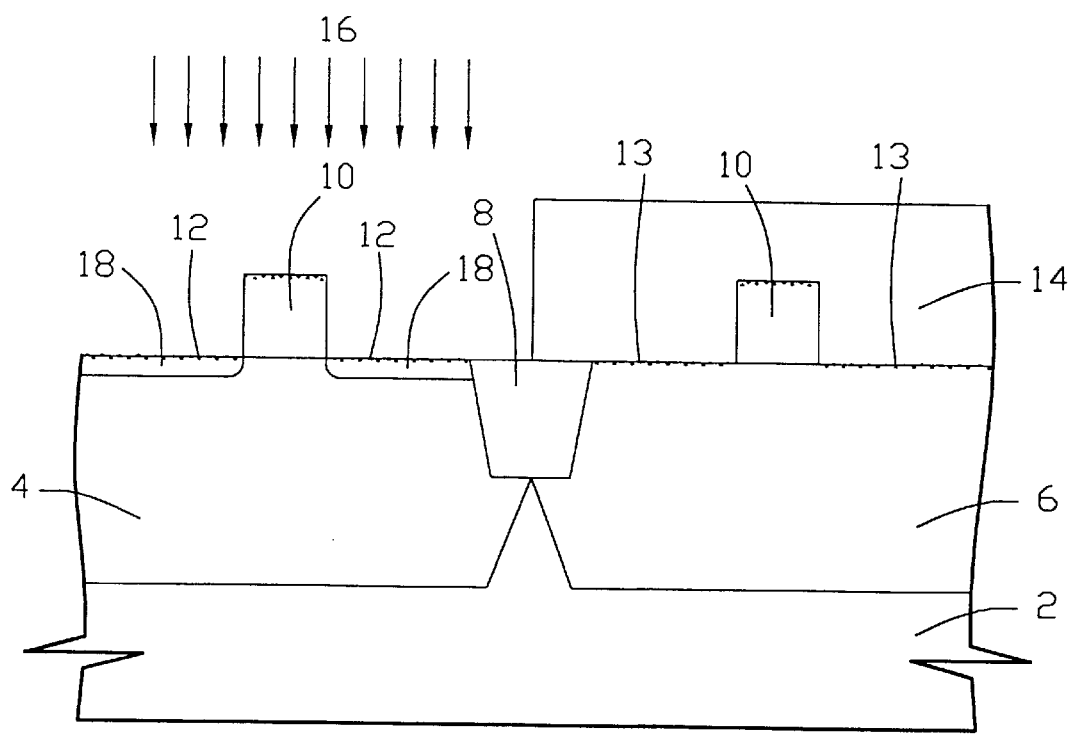
Figure 1C:
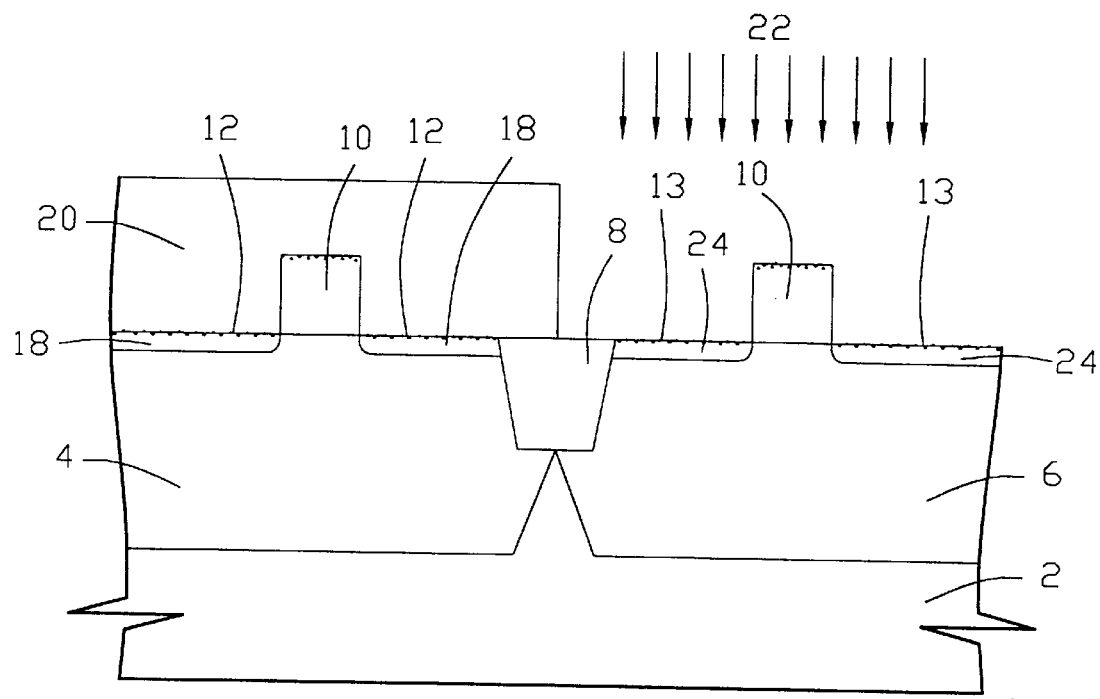
Figure 1D:
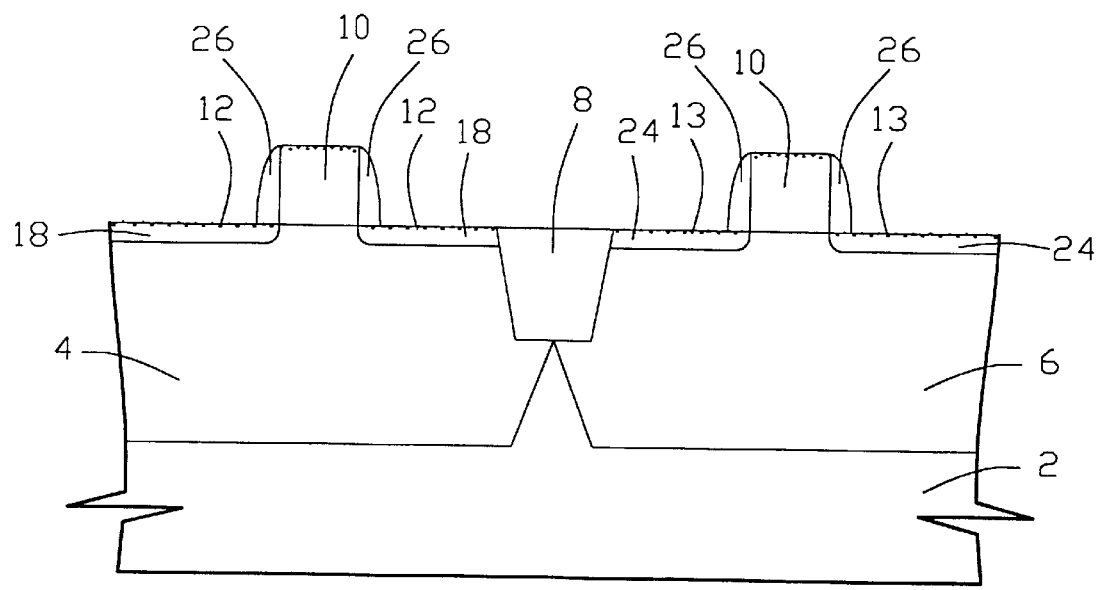
Figure 1E:
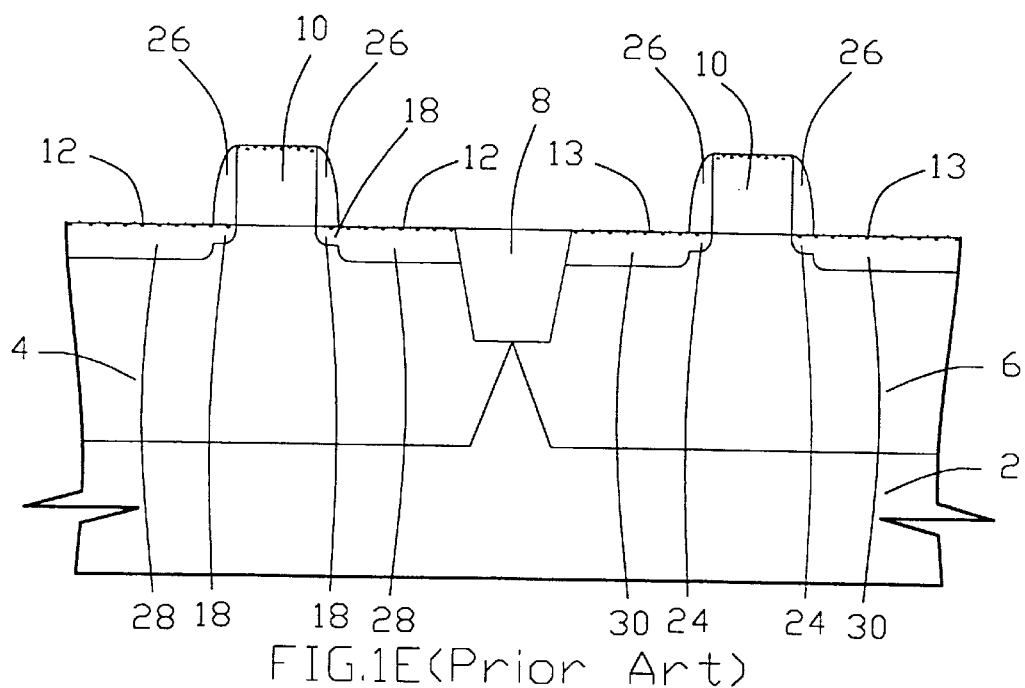
Figure 2A:
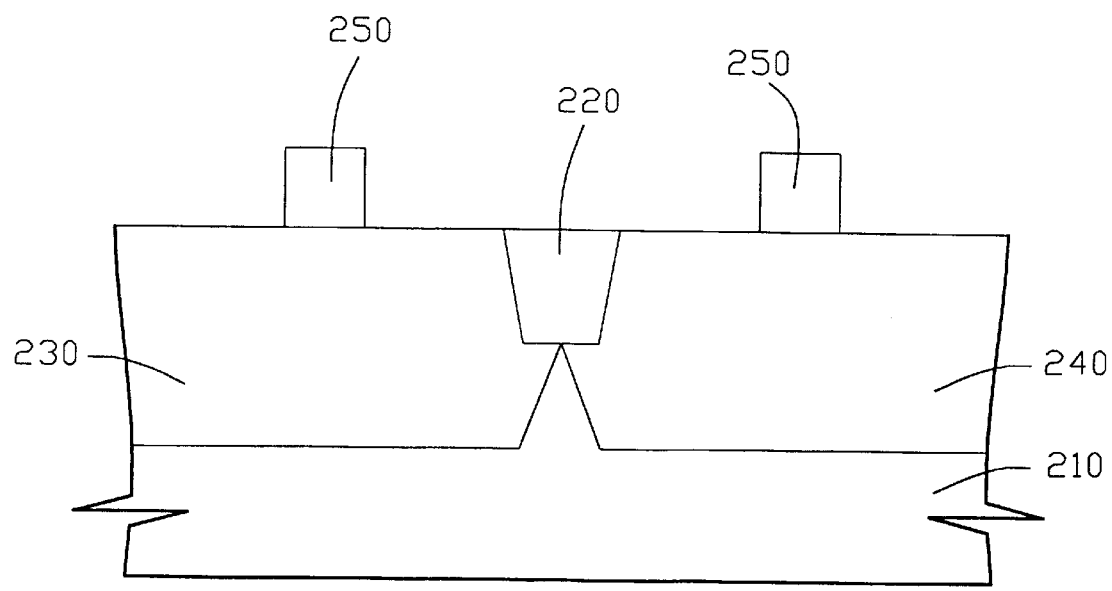
FIGS. 2A to 2F show cross-sectional views illustrative of various stages in the fabrication of a Complementary Metal-Oxide-Semiconductor device having ultra-shallow junctions in accordance with one embodiment of the present invention.

As illustrated in FIG. 2A, firstly, a semiconductor substrate 210 including a shallow trench isolation region 220, an n-well region 230 and a p-well region 240 is provided. Poly-gates 250 are formed over the n-well region 230 and the p-well region 240 respectively. The above processes are well known in the prior art, which are not the focus of the present invention, hence they will not be described in greater detail.

Figure 2B:
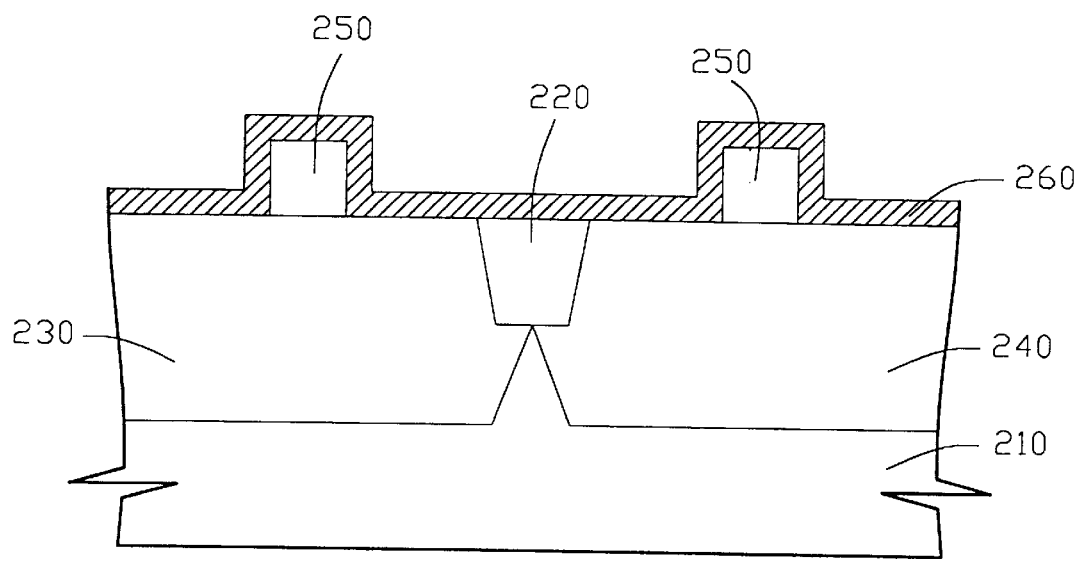

Referring to FIG. 2B, in this embodiment, a nitrogen oxide (such as NO, $N_2O$) layer 260 is formed on the surface of the aforesaid structure by furnace or rapid thermal oxidation (RTO). The thickness of the nitrogen oxide (such as NO, $N_2O$) layer 260 is about between 20 nm and 30 nm herein. A nitrogen oxide (such as NO, $N_2O$) layer 260 is used as the diffusion source. After bonding is broken between nitrogen and oxygen in the nitrogen oxide (such as NO, $N_2O$) layer, activity of nitrogen will become great, so as to catch a boron ion easily. Thus, good ultra-shallow junctions can be formed integrally on the silicon substrate due to the fact that nitrogen can catch the boron ions easily.

Figure 2C:
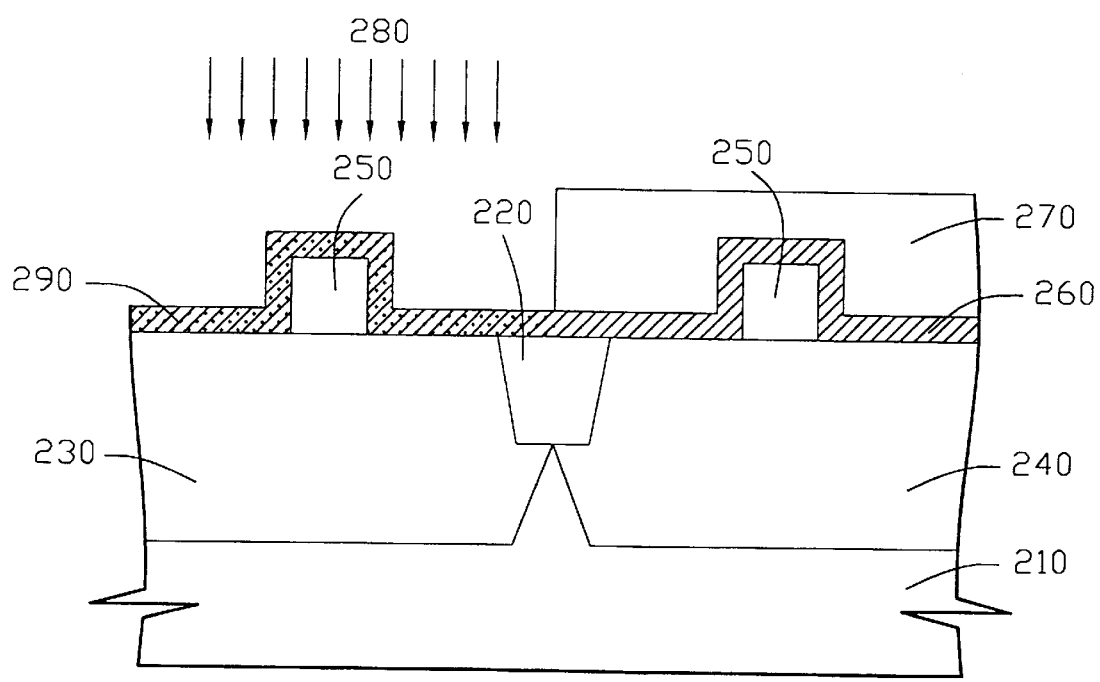

Referring to FIG. 2C, in this embodiment, a photoresist layer 270 is formed over the p-well region 240 serving as an ion implantation mask. The p-type ion implantation 280 is then carried out to dope a part of the diffusion source layer formed a p-type diffusion source layer 290 over the n-well region 230 using $BF_2$ or boron ions with energy of between 2 keV and 8 keV, the dosage being between about $10^{14}$ and $10^{15}$ herein.

Figure 2D:
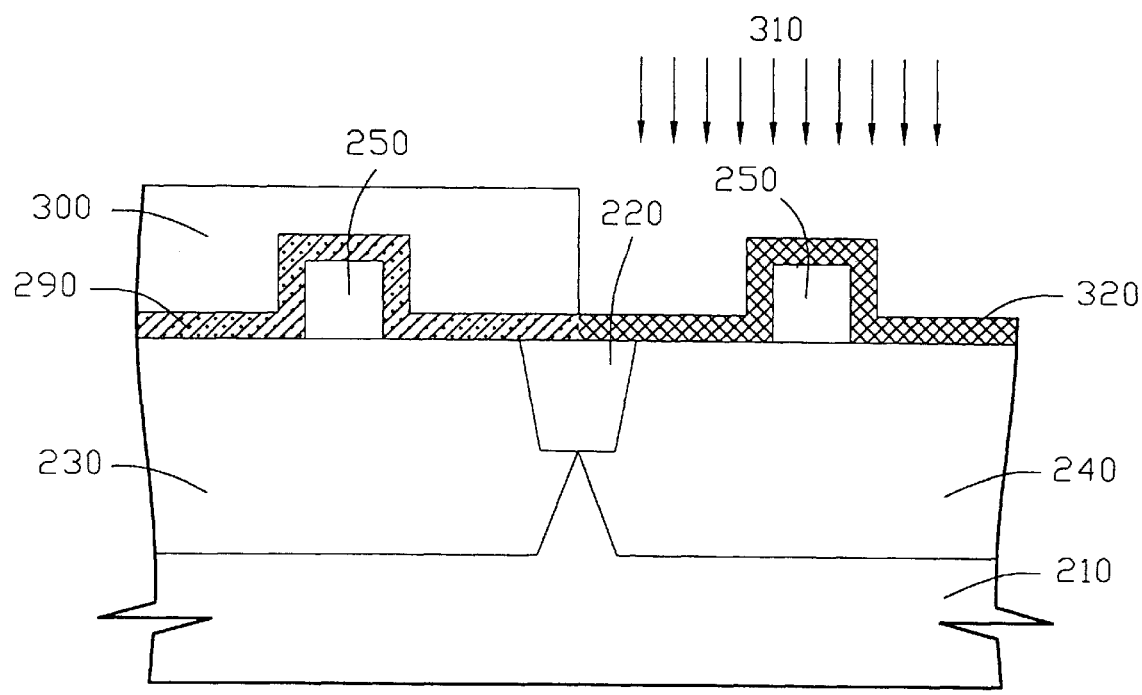

Referring to FIG. 2D, in this embodiment, after removing the photoresist layer 270, another photoresist layer 300 is formed over the n-well region 230 serving as an ion implantation mask. The n-type ion implantation 310 is then carried out to dope the other part of the diffusion source layer forming an n-type diffusion source layer 320 over the p-well region 240, using arsenic ions or phosphorous ions with energy of between 2 KeV and 8 KeV, the dosage being between about $10^{14}$ and $10^{15}$ herein.

Figure 2E:
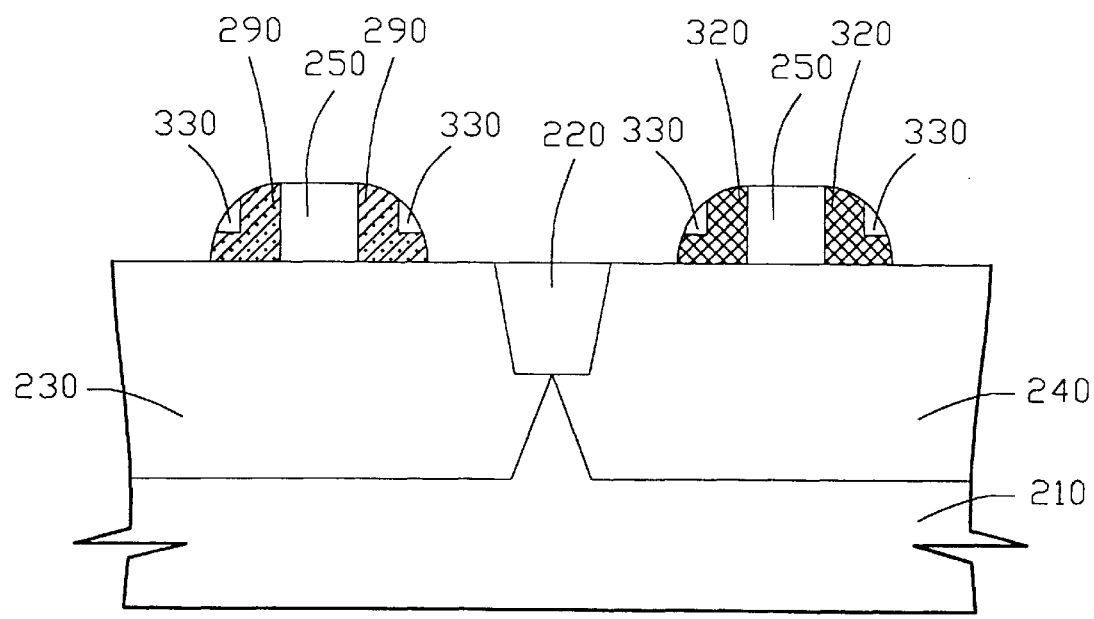

Referring to FIG. 2E, in this embodiment, the spacers 330 are formed on the sidewall of the poly-gates by depositing and etching back after removing the photoresist layer 300. But the spacers comprise the portions of the n-type diffusion source layer 320 over the p-well region 240 and the p-type diffusion source layer 290 over the n-well region 230 both, such as nitrogen oxide.

Figure 2F:
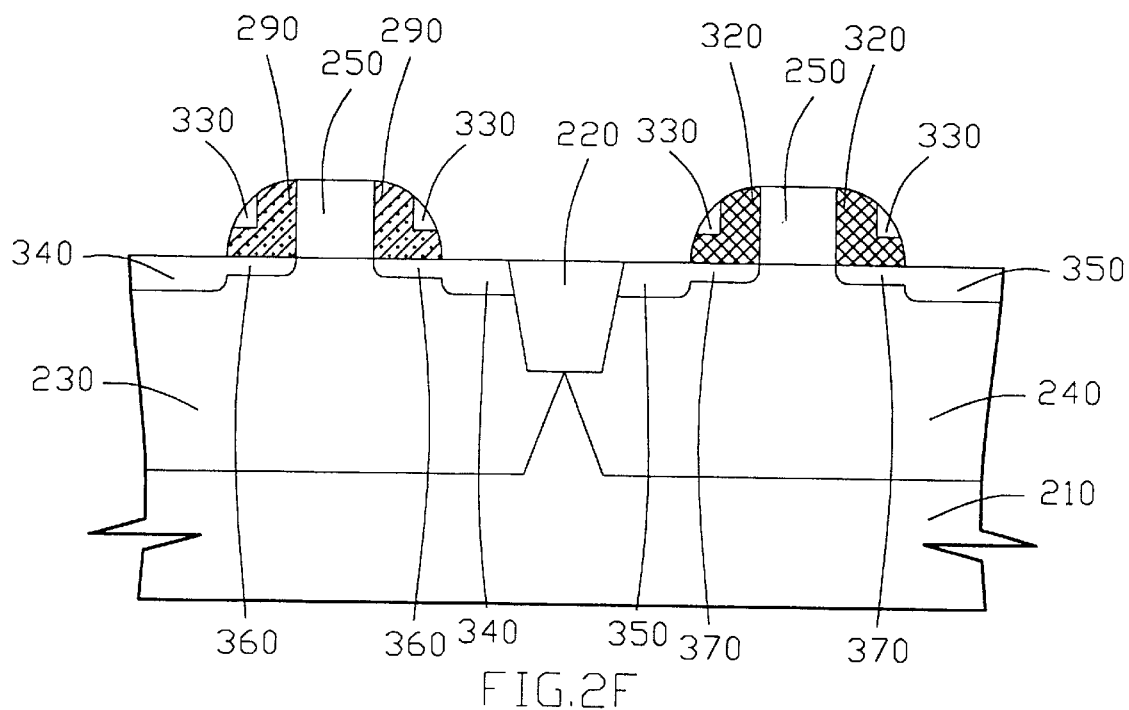

Referring to FIG. 2F, in this embodiment, the n-type deep source/drain implantation (not shown in figures) and the p-type deep source/drain implantation (not shown in figures) are carried out once again to the n-well region 230 and the p-well region 240 respectively. Then, the boron ions and arsenic ions or phosphorous ions are out-diffused into substrate 210 from nitrogen oxide (such as NO, $N_2O$) layer 290 and 320 by performing one step rapid thermal process at about 950° C. and 1050° C. for about 10 seconds and 20 seconds (not shown in figures). Hence, n-type source/drain regions 340 and p-type source/drain regions 350 can be formed in the Complementary Metal-Oxide-Semiconductor devices. N-type ultra-shallow junctions 360 and P-type ultra-shallow junctions 370 can be formed too.

In this embodiment of the present invention, the short channel effect is reduced by means of forming ultra-shallow junctions. Transient enhance diffusion (TED) and Oxygen enhance diffusion (OED) can be eliminated from this process, similarly, ion channel effect can be reduced as well. It is foremost that the process of the present invention is not like as Ge Pre-amorphize implantation that causes damage on the silicon substrate. And yet, it does not change the apparatus to reach the economic effect of this method. Thus the method of the present invention is the best Complementary Metal-Oxide-Semiconductor compatible process for deep sub-micro process.

Obviously, many modifications and variations of the present invention are possible in light of the above teachings. It is therefore to be understood that within the scope of the appended claims, the present invention may be practiced other than as specifically described herein.

What is claimed is:

1. A method for forming a semiconductor device having shallow junctions, comprising:

providing a semiconductor substrate having a shallow trench isolation region, a well region with a first conductivity and a well region with a second conductivity;

forming a first gate on said well region with the first conductivity and forming a second gate on said well region with the second conductivity;

forming a first diffusion source layer on said semiconductor substrate wherein said first diffusion source layer comprises nitrogen oxide;

forming a first photoresist layer over said well region with the second conductivity;

forming a diffusion source layer with the second conductivity by carrying out a first ion implantation with the second conductivity to dope a part of said diffusion source layer formed over said well region with the first conductivity;

removing said first photoresist layer over said well region with the second conductivity;

forming a second photoresist layer over said well region with the first conductivity;

forming a second diffusion source layer with the first conductivity by carrying out a second ion implantation with the first conductivity to dope another part of said diffusion source layer formed over said well region with the second conductivity;

removing said second photoresist layer on said well region with the first conductivity;

forming spacers on sidewalls of said first gate and said second gate and said diffusion source layer and said second diffusion source layer;

carrying out a third ion implantation with the first conductivity and fourth ion implantation with the second conductivity to dope respective said diffusion source layer with the first conductivity and said diffusion source layer with the second conductivity; and forming source/drain regions and shallow junctions in said well region with the second conductivity and said well region with the first conductivity, respectively.

2. The method according to claim 1, wherein said first and second gates are formed on said well region with the first conductivity and said well region with the second conductivity of said semiconductor substrate by depositing and etching.

3. The method according to claim 1, wherein said first diffusion source layer comprises a nitrogen oxide layer with a thickness of between 20 nm and 30 nm.

4. The method according to claim 1, wherein said first diffusion source layer is formed on said semiconductor substrate by using a furnace or a rapid thermal oxidation process.

5. The method according to claim 1, wherein said first ion implantation is carried out by using $BF_2$ or boron ions with an energy of between 2 KeV and 8 KeV.

6. The method according to claim 1, wherein said second ion implantation is carried out by using arsenic ions or phosphorous ions with an energy of between 2 KeV and 8 KeV.

7. The method according to claim 1, wherein said second diffusion source layer with the first conductivity comprises arsenic or phosphorous ions herein.

8. The method according to claim 1, wherein said diffusion source layer comprises $BF_2$ or boron ions herein.

9. The method according to claim 1, wherein said spacers are formed by depositing and etching back on said first and second gates of semiconductor substrate.

10. The method according to claim 1, wherein said spacers comprises nitrogen oxide.

11. The method according to claim 1, wherein said source/drain regions and said shallow junctions in said well regions with the second and the first conductivity are formed by using rapid thermal process (RTP) method to said semiconductor substrate at about 950° C. and 1050° C. for about 10 seconds and 20 seconds.

* * * * *